US011480465B2

(12) United States Patent
Kweon et al.

(10) Patent No.: US 11,480,465 B2
(45) Date of Patent: Oct. 25, 2022

(54) QUENCHING BIAS CIRCUIT DEVICE AND SINGLE PHOTON DETECTOR COMPRISING THE SAME

(71) Applicants: HYUNDAI MOTOR COMPANY, Seoul (KR); KIA CORPORATION, Seoul (KR); SOGANG UNIVERSITY RESEARCH & BUSINESS DEVELOPMENT FOUNDATION, Seoul (KR)

(72) Inventors: Kyoung-Chun Kweon, Seoul (KR); Him-Chan Park, Seoul (KR); Jin-Wook Burm, Seoul (KR)

(73) Assignees: HYUNDAI MOTOR COMPANY, Seoul (KR); KIA CORPORATION, Seoul (KR); SOGANG UNIVERSITY RESEARCH & BUSINESS DEVELOPMENT FOUNDATION, Seoul (KR)

( * ) Notice: Subject to any disclaimer, the term of this patent is extended or adjusted under 35 U.S.C. 154(b) by 0 days.

(21) Appl. No.: 17/324,678

(22) Filed: May 19, 2021

(65) Prior Publication Data
US 2022/0090961 A1  Mar. 24, 2022

(30) Foreign Application Priority Data

Sep. 21, 2020  (KR) .......................... 10-2020-0121528

(51) Int. Cl.
*G01J 1/44* (2006.01)
*H01L 31/107* (2006.01)

(52) U.S. Cl.
CPC .............. *G01J 1/44* (2013.01); *H01L 31/107* (2013.01); *G01J 2001/442* (2013.01); *G01J 2001/4466* (2013.01)

(58) Field of Classification Search
CPC ................... G01J 1/44; G01J 2001/442; G01J 2001/4466; H01L 31/107
See application file for complete search history.

(56) References Cited

U.S. PATENT DOCUMENTS

| 9,671,284 B1* | 6/2017 | Dandin | .................. H03K 17/74 |
| 2006/0027736 A1* | 2/2006 | Ichino | ............... H01L 31/02027 250/214 R |
| 2015/0276474 A1* | 10/2015 | Okada | ...................... G01J 1/44 250/214 A |

(Continued)

FOREIGN PATENT DOCUMENTS

| KR | 20170087639 A | * 7/2017 |
| KR | 10-1917023 B1 | 11/2018 |

*Primary Examiner* — Thanh Luu
*Assistant Examiner* — Monica T Taba
(74) *Attorney, Agent, or Firm* — Morgan, Lewis & Bockius LLP

(57) ABSTRACT

Disclosed herein is a quenching bias circuit device capable of operating without a time difference even in a variance in single photon avalanche diode (SPAD). The quenching bias circuit device includes: a light receiving element; a feedback current mirror circuit arranged between a supply voltage and the light receiving element and configured to induce a passive quenching operation so as to maintain a current flowing in the light receiving element to be constant; and a bias quenching circuit connected to a sensing node of the light receiving element and configured to perform an active quenching operation.

14 Claims, 18 Drawing Sheets

(56) References Cited

U.S. PATENT DOCUMENTS

2015/0285625 A1* 10/2015 Deane ................ G01S 17/42
348/140
2018/0120152 A1* 5/2018 Leonardo .............. G01T 1/40
2022/0003806 A1* 1/2022 Lilic ..................... G01J 1/44

* cited by examiner

-PRIOR ART-

-PRIOR ART-

-PRIOR ART-

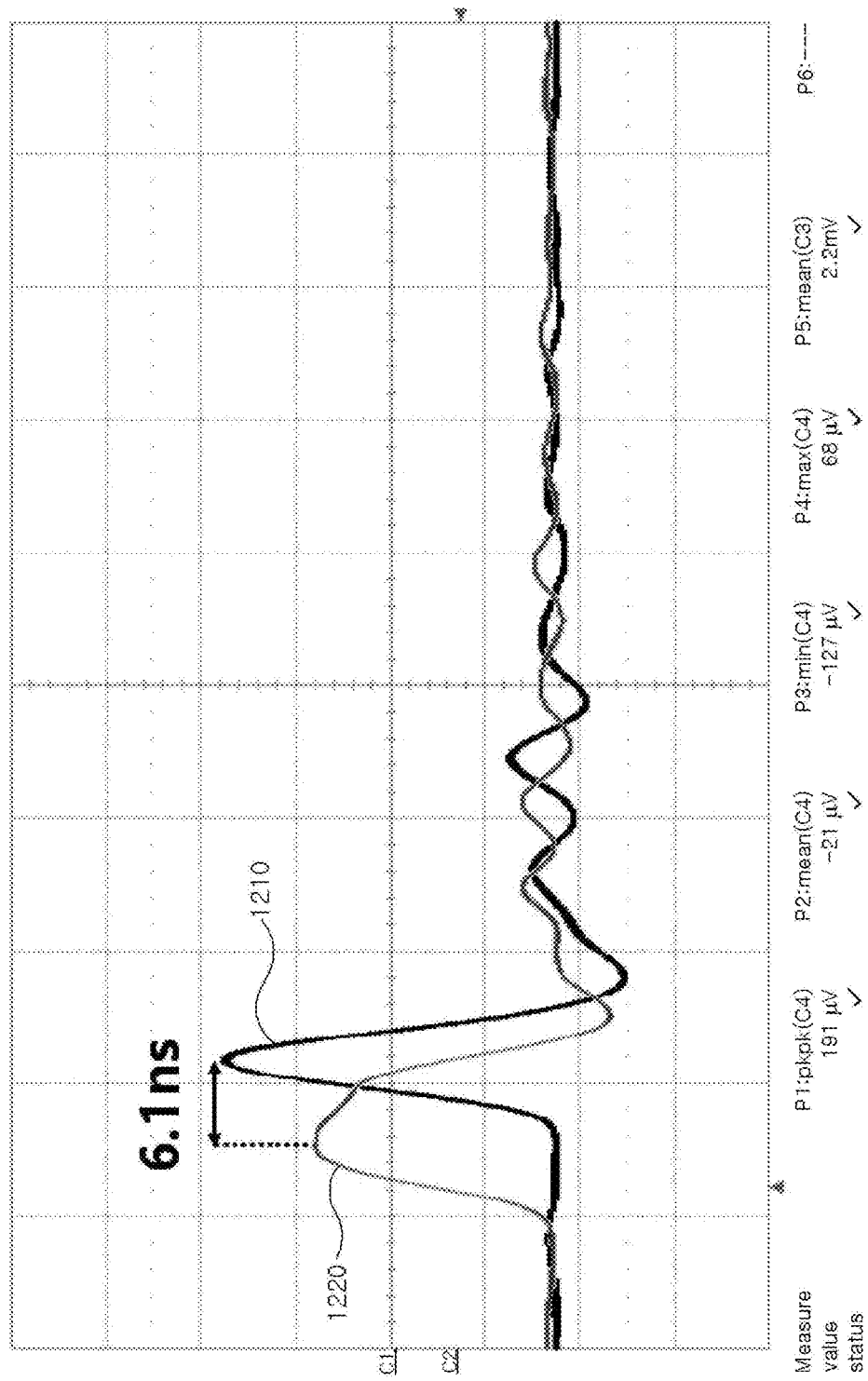

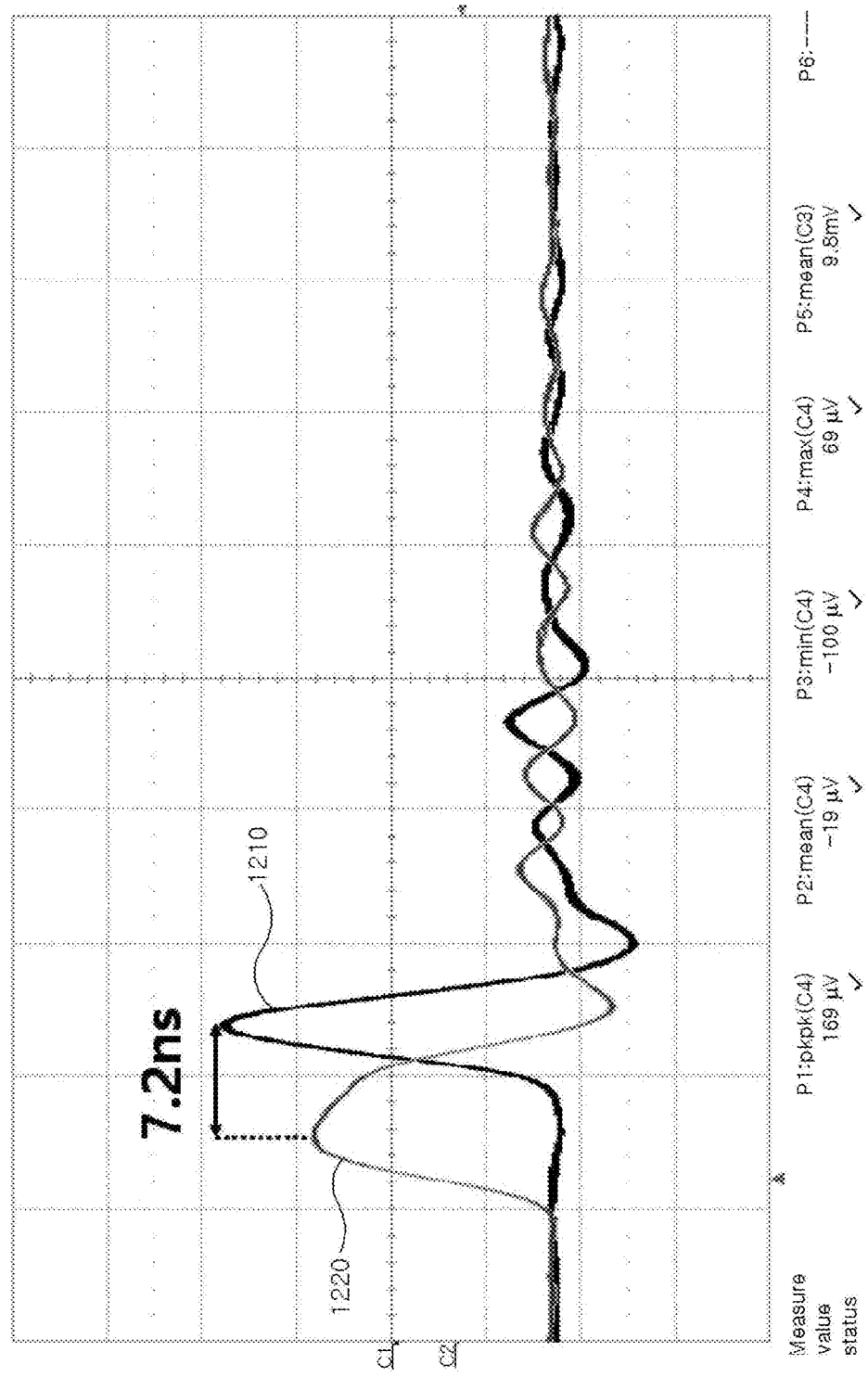

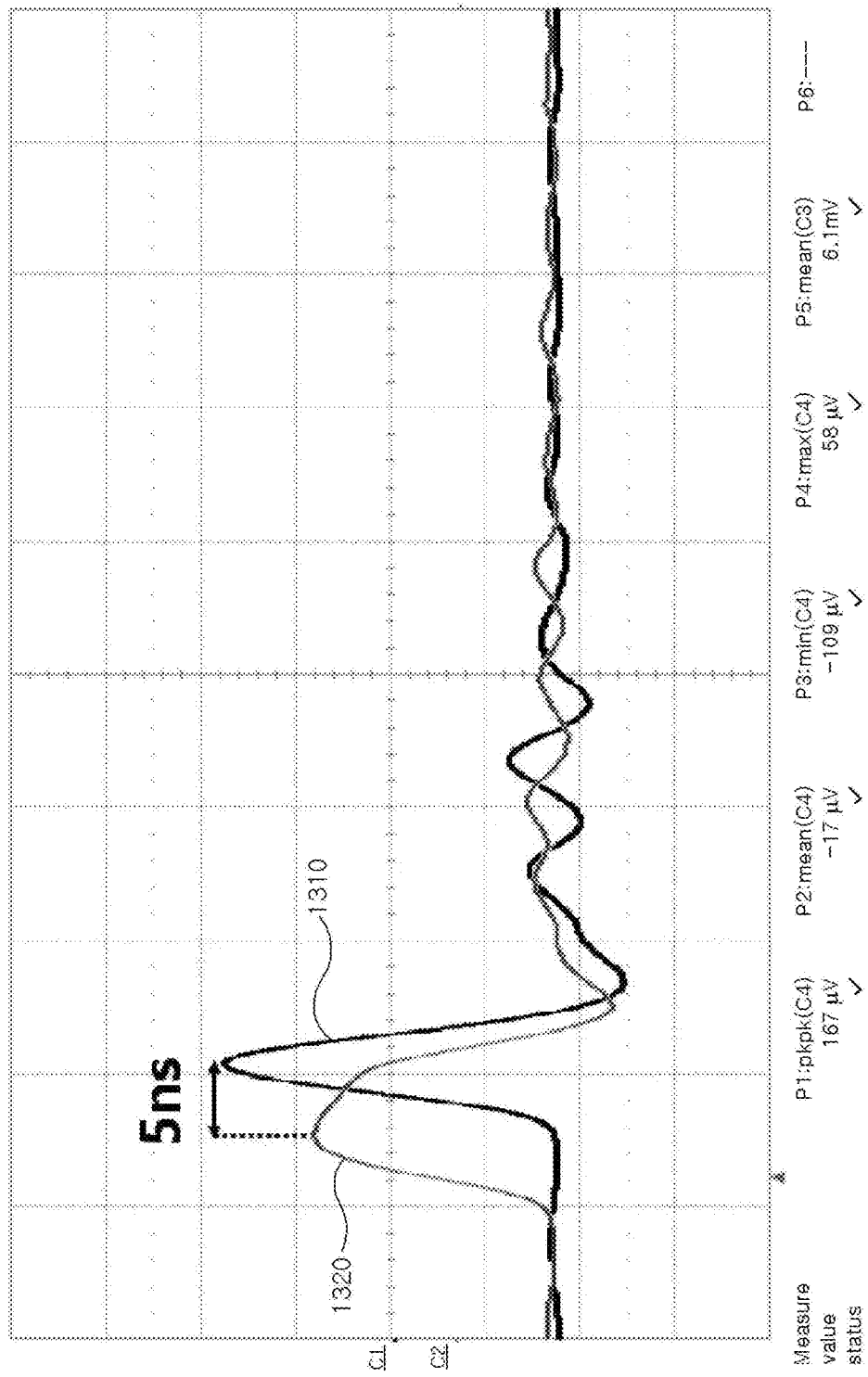

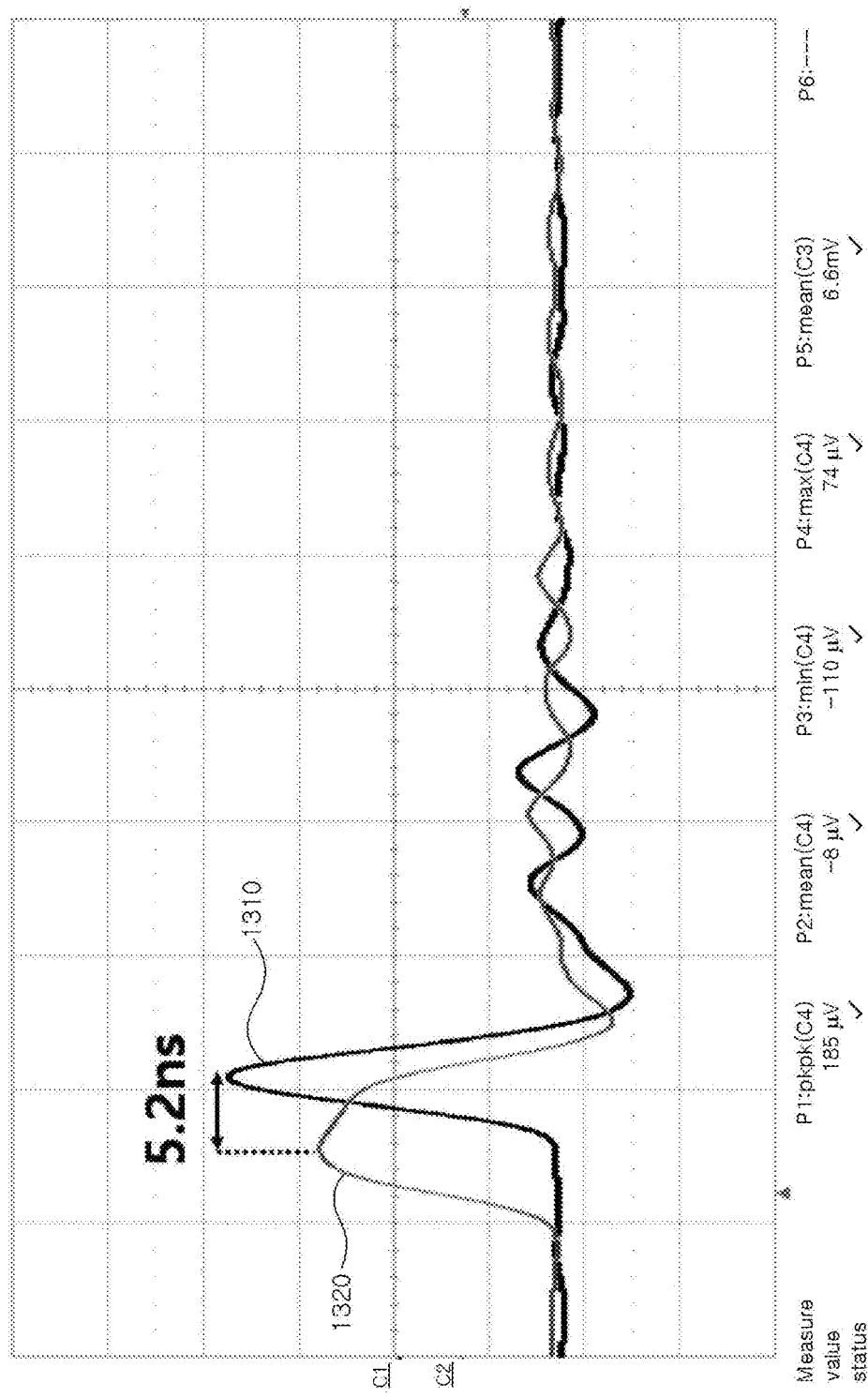

QUENCHING BIAS CIRCUIT DEVICE AND SINGLE PHOTON DETECTOR COMPRISING THE SAME

CROSS-REFERENCE(S) TO RELATED APPLICATIONS

This application claims the benefit of priority to Korean Patent Application No. 10-2020-0121528, filed on Sep. 21, 2020 in the Korean Intellectual Property Office, which is incorporated herein by reference in its entirety.

TECHNICAL FIELD

The present disclosure relates to a quenching bias circuit device including a light receiving element so as to detect light and a single photon detector including the same.

BACKGROUND

In the case of a general bias circuit as illustrated in FIGS. 1 and 2, when a photon is injected into a Single Photon Avalanche Diode (SPAD), a very small current flows in a resistor $R_B$ which is a passive component, and a voltage Vs of a sensing node slightly drops compared to $V_{HIGH}$. The drop voltage of the sensing node is more quickly dropped to a ground through a bias circuit to perform a quenching operation and then passes an inverter to generate a pulse. As a result, when one photon is injected, one pulse is generated. Simultaneously, when the voltage drops to the ground and then drops to a voltage at which a breakdown of the SPAD does not occur, the voltage is reset to restore to $V_{HIGH}$ again.

However, as shown in FIG. 3, owing to a variance in SPAD, a difference in occurrence time and a difference in pulse width occur, and there is no part for correcting the differences. Therefore, in order to check an incident time of a photon when a device for a time and a distance, such as a time to digital converter (TDC), is applied behind a quenching circuit, an error may be caused.

The contents described in the above Description of Related Art are to aid understanding of the background of the present disclosure and may include what is not previously known to a person of ordinary skill in the art to which the present disclosure pertains.

SUMMARY

An embodiment of the present disclosure is directed to provide a quenching bias circuit device and a single photon detector including the same, which are capable of operating without a time difference even in a variance of a single photon avalanche diode (SPAD).

Other objects and advantages of the present disclosure can be understood by the following description and become apparent with reference to the embodiments of the present disclosure. Further, it is obvious to those skilled in the art to which the present disclosure pertains that the objects and advantages of the present disclosure can be realized by the means as claimed and combinations thereof.

In accordance with an embodiment of the present disclosure, a quenching bias circuit device includes: a light receiving element, a feedback current mirror circuit located between a supply voltage and the light receiving element and configured to induce a passive quenching operation so as to maintain a current flowing in the light receiving element to be constant, and a bias quenching circuit connected to a sensing node of the light receiving element and configured to perform an active quenching operation.

The feedback current mirror circuit may include a first feedback current mirror circuit configured to receive the supply current, and a second feedback current mirror configured to induce a current, which is induced through the first feedback current mirror circuit, to the light receiving element.

A plurality of NPN transistors may be disposed and matched to each other in the first feedback current mirror circuit, and a plurality of PNP transistors may be disposed and matched to each other in the second feedback current mirror circuit.

The light receiving element may be a single photon light receiving element (single photon avalanche diode (SPAD)).

The quenching bias circuit device may further include a feedback operation control circuit configured to compare a sensing voltage of the sensing node with a preset reference value and determine the passive quenching operation according to the comparison result.

The feedback operation control circuit may include a first comparator configured to compare the sensing voltage with a first reference value among the reference values, a second comparator configured to compare the sensing voltage with a preset second reference value that is smaller than the first reference value, and a control logic configured to generate a control signal for the passive quenching operation according to the comparison result.

The control signal may be a quenching path control signal which executes the passive quenching operation or a non-quenching path control signal which does not execute the passive quenching operation.

The first reference value and the second reference value may be arbitrarily set for sensing sensitivity of the light receiving element.

The quenching bias circuit device may further include a feedback operation control circuit configured to execute the passive quenching operation which maintains a current flowing in the light receiving element to be constant according to the determination of the passive quenching operation.

The feedback operation execution circuit may include a first switching element configured to conduct first power from a first charge pump in response to the quenching path control signal, a first capacitor connected in parallel to the first switching element and configured to be charged with the first power, and a second capacitor connected in parallel to the first capacitor and configured to output an applied voltage, which is applied to the feedback current mirror circuit, using the supply voltage and the first power.

The feedback operation execution circuit may include a second switching element configured to conduct second power from a second charge pump in response to the non-quenching path control signal, a third capacitor connected in parallel to the second switching element and configured to be charged with the second power, and a third comparator connected in parallel to the third capacitor and configured to generate a hold-off operation signal for a hold-off operation of the feedback current mirror circuit using the supply voltage and the second power.

A third switching element configured to connect, when the hold-off operation signal is not generated, an output of the third capacitor to the second capacitor may be disposed between the third comparator and the second capacitor.

A fourth switching element grounded in parallel may be disposed at a front stage of the first capacitor, the second capacitor, and the third capacitor.

The supply current may be constantly input to the feedback current mirror circuit.

In accordance with another embodiment of the present disclosure, a single photon detector includes the quenching bias circuit device.

BRIEF DESCRIPTION OF THE DRAWINGS

FIGS. 12A to 12C are graphs showing test results of the conventional bias circuit.

FIGS. 13A to 13C are graphs showing test results of the quenching bias circuit device of the present disclosure.

DESCRIPTION OF SPECIFIC EMBODIMENTS

Reference should be made to the accompanying drawings that illustrate exemplary embodiments of the present disclosure, and to the description in the accompanying drawings in order to fully understand the present disclosure and operational advantages of the present disclosure, and objects attained by practicing the present disclosure.

In describing exemplary embodiments of the present disclosure, known technologies or repeated descriptions may be reduced or omitted to avoid unnecessarily obscuring the gist of the present disclosure.

Figure 1:
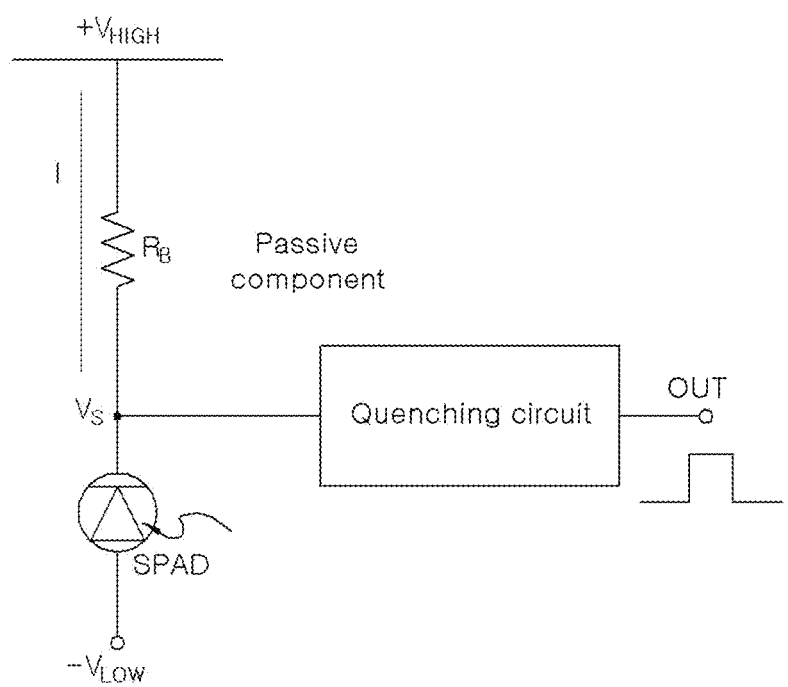
FIGS. 1 and 2 are diagrams illustrating general bias circuits.
Figure 2:
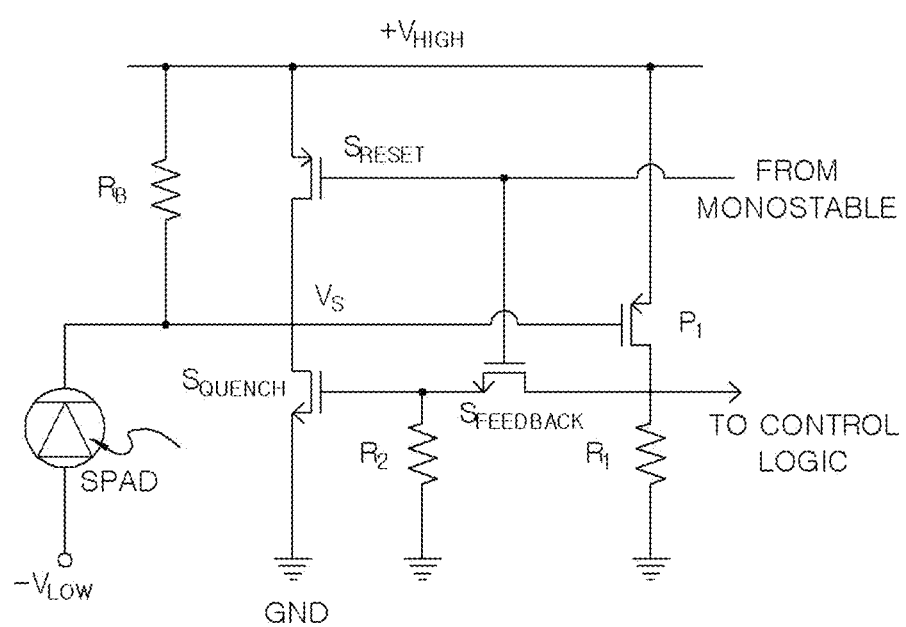
Figure 3:
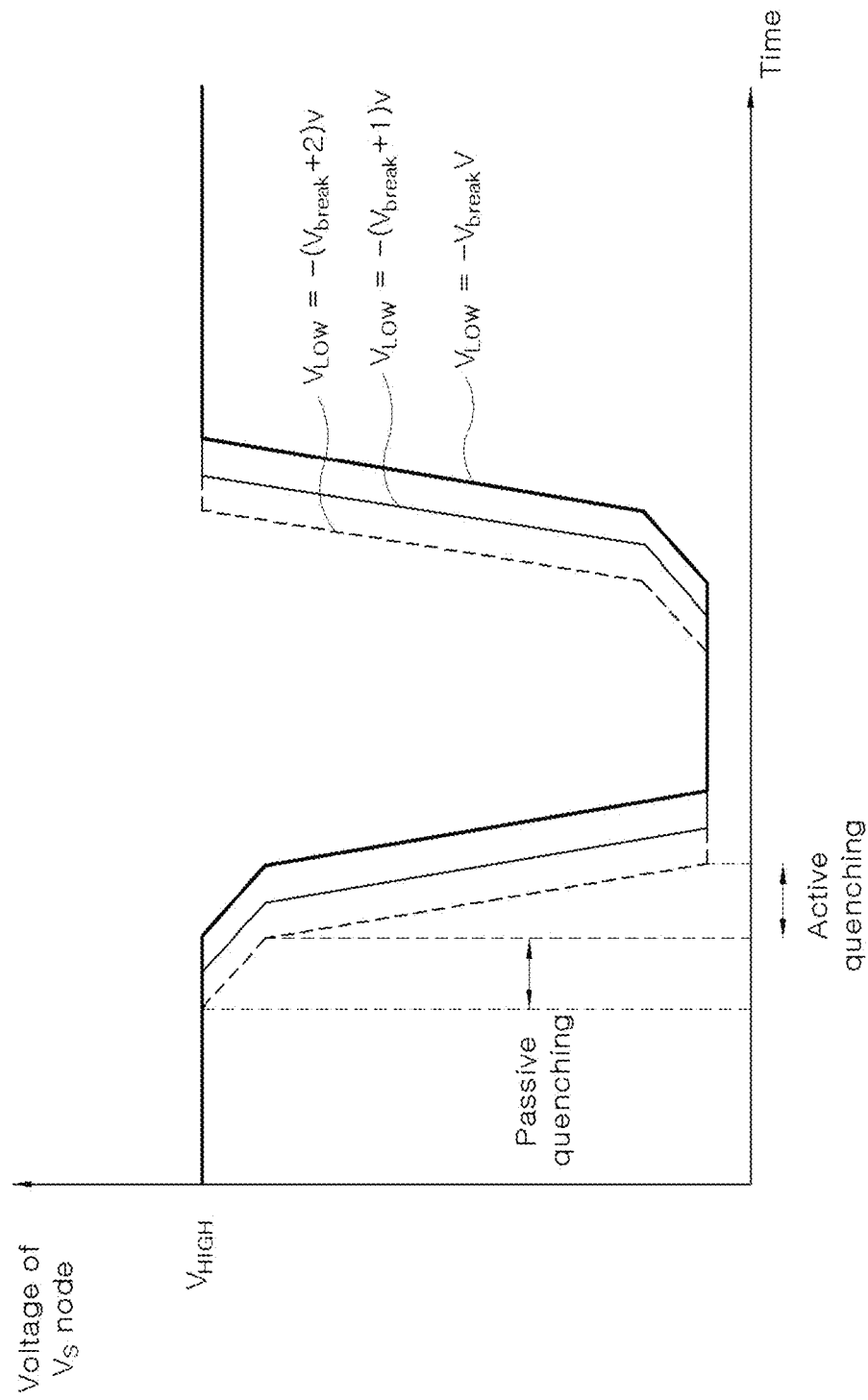
FIG. 3 is a graph illustrating a time difference according to quenching operations at sensing nodes and a variance in light receiving element of the general bias circuits of FIGS. 1 and 2.
Figure 4:
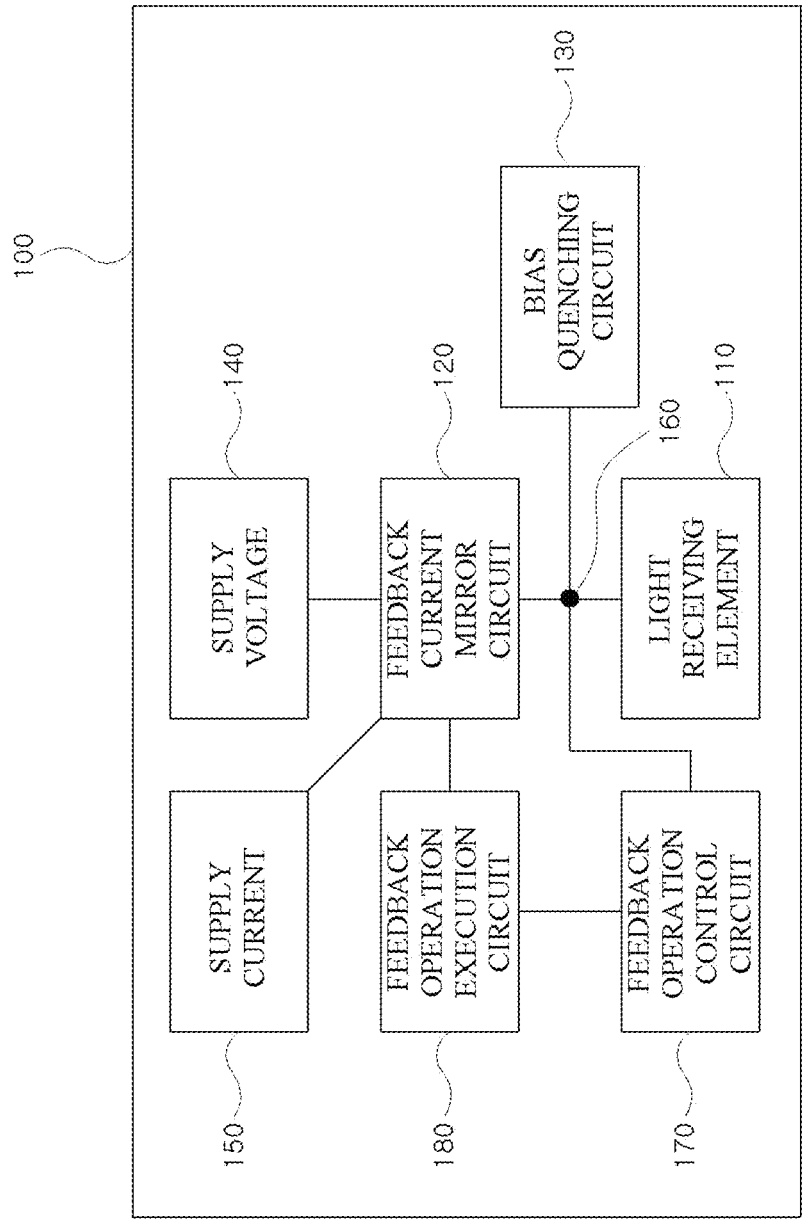
FIG. 4 is a block diagram illustrating a quenching bias circuit device of the present disclosure.
Figure 5:
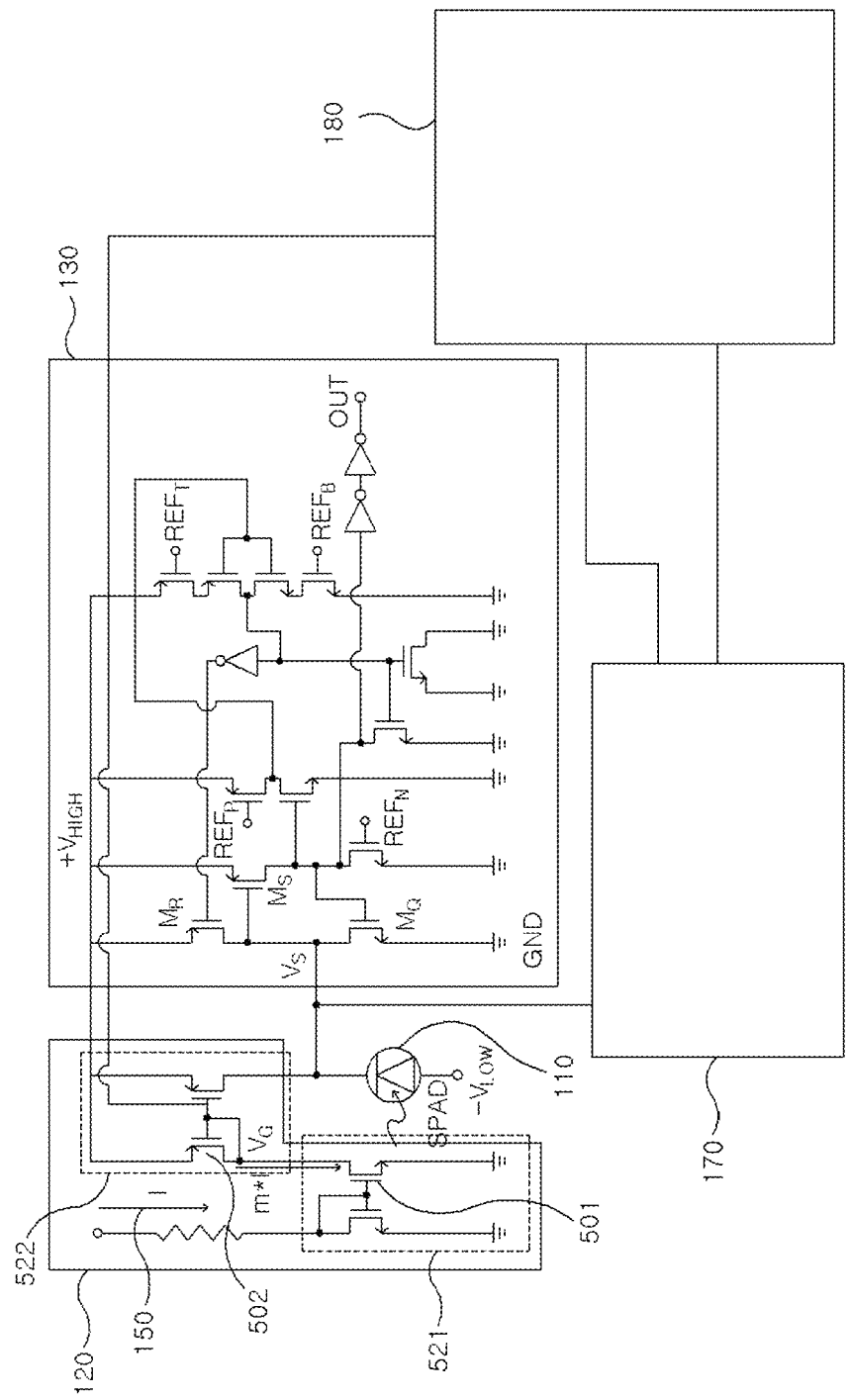
FIGS. 5 to 7 are partial diagrams illustrating the quenching bias circuit device of the present disclosure.
Figure 6:
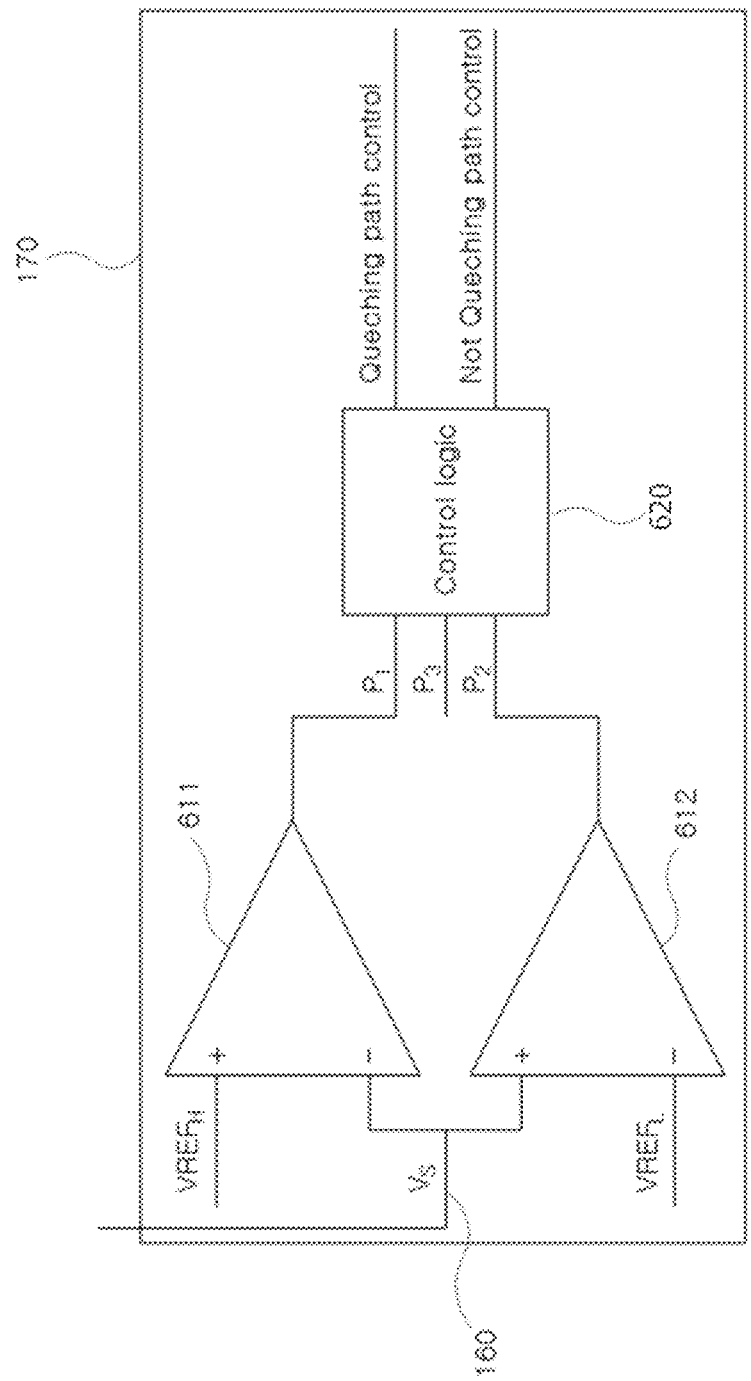
Figure 7:
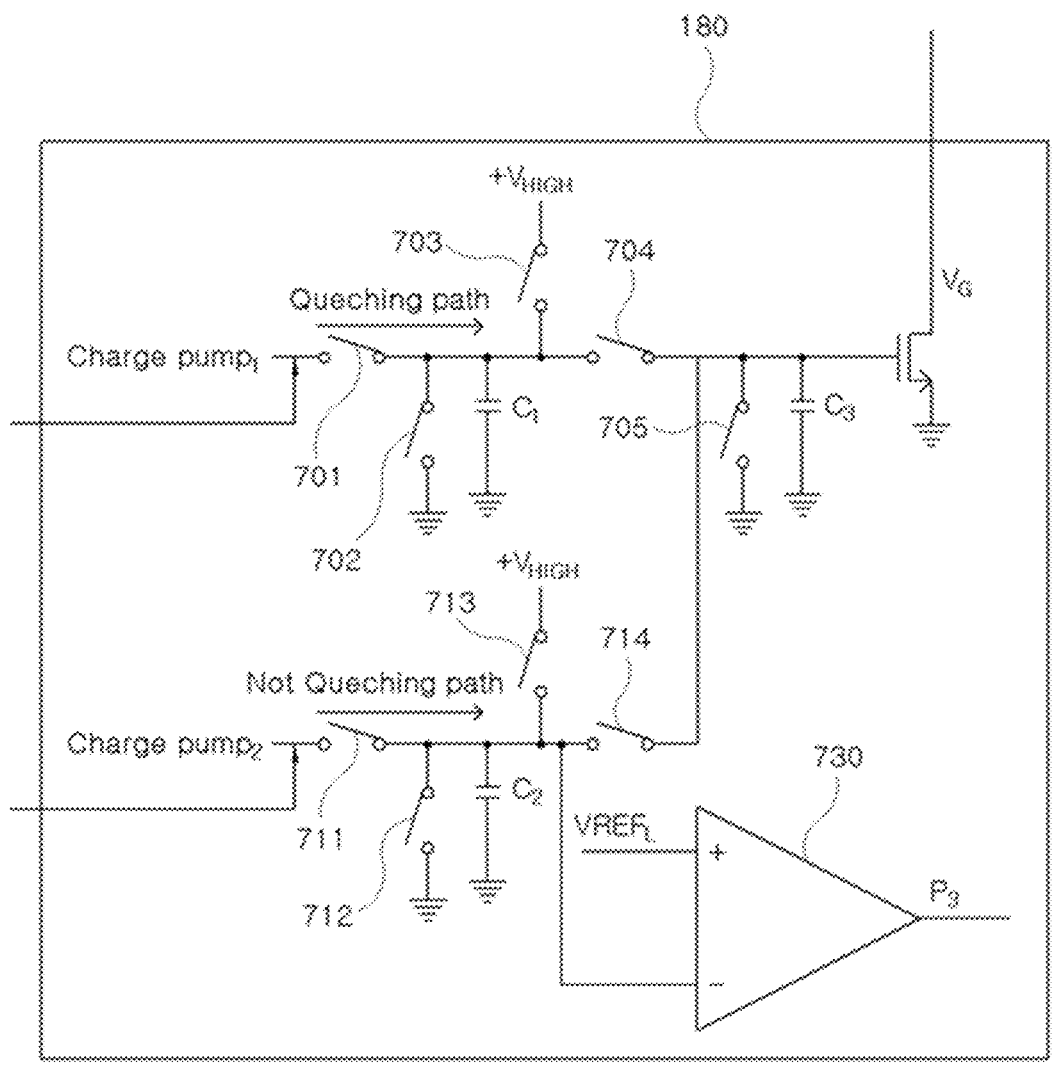

FIG. 4 is a block diagram illustrating a quenching bias circuit device of the present disclosure, and FIGS. 5 to 7 are partial diagrams illustrating the quenching bias circuit device of the present disclosure.

Hereinafter, a quenching bias circuit device according to one embodiment of the present disclosure and a single photon detector including the same will be described with reference to FIGS. 4 and 5.

A quenching bias circuit device 100 according to one embodiment of the present disclosure is a bias circuit used in a single photon detector and includes a light receiving element 110, a feedback current mirror circuit 120, a bias quenching circuit 130, a feedback operation control circuit 170, a feedback operation execution circuit 180.

In addition, a supply voltage 140 and a supply current 150 are applied through a current/voltage supplier.

The light receiving element 110 may convert light into electricity and may be a single photon avalanche diode (SPAD) for detecting a single photon. The SPAD which is the light receiving element 110 causes changes in various operation due to a variance in process, voltage, and temperature (PVT).

The feedback current mirror circuit 120 induces a passive quenching.

Unlike the related art, according to the present disclosure, the bias quenching circuit 130 is used for an active quenching instead of a passive component. The feedback current mirror circuit 120 is located between the supply voltage 140 and a sensing node 160. The feedback current mirror circuit 120 maintains a current flowing in the light receiving element 110 to be constant. The feedback current mirror circuit 120 is employed so that it is possible to maintain the current flowing in the light receiving element 110 to be constant without a drop of the current. To this end, the supply current 150 input to the feedback current mirror circuit 120 may be constant.

In order to keep the current flowing in the light receiving element constant with less error, the feedback current mirror circuit 120 may include a first feedback current mirror circuit 521 having an NPN type transistor 501 and a second feedback current mirror circuit 522 having a PNP type transistor 502.

That is, the supply current 150 is input to the first feedback current mirror circuit 521 including a first switching element 501, and a current induced through the first feedback current mirror circuit 521 is induced as a current flowing in the light receiving element 110 through the second feedback current mirror circuit 522 including a second switching element 502 so that it is possible to maintain the current flowing in the light receiving element 110 to be constant. The first switching element 501 may be an NPN type transistor, and the second switching element 502 may be a PNP type transistor.

In order to increase accuracy in maintaining the flowing current to be constant, a feedback operation control circuit 170 and a feedback operation execution circuit 180 may be further employed. The feedback operation control circuit 170 may detect a variation in voltage at the sensing node 160 more closely, detect an additional current generated from the light receiving element 110, determine an operation of the feedback operation execution circuit 180, and finally, set an amount of a current flowing in each of the light receiving element 110 and the feedback current mirror circuit 120 to be constant.

The bias quenching circuit 130 performs a quenching operation. A basic quenching operation is as follows. When a photon is incident on the SPAD, a weak photon current flows. In this case, owing to a passive component, a passive quenching phenomenon in which a voltage drop occurs at $V_{HIGH}$ (Supply voltage) occurs. Subsequently, when active components such as semiconductor elements ($M_R$, $M_Q$, $M_S$, and the like) detect a slight voltage drop, the active elements perform an active quenching operation of forcibly lowering a voltage quickly. To this end, driving reference voltages $REF_P$, $REF_N$, $REF_B$, and $REF_T$ are applied. A range of each of the driving reference voltages $REF_P$, $REF_N$, $REF_B$, and $REF_T$ may be arbitrarily set so as to adjust sensing sensitivity. Field effect transistors (FETs), metal oxide semiconductor FETs (MOSFETs), and the like may be used as the semiconductor elements.

Thus, when a photon is injected into the light receiving element 110, a very small current flows through the passive component, and the voltage of the sensing node 160 slightly drops compared to $V_{LOW}$. The drop voltage of the sensing node 160 drops more quickly to a ground GND through a bias circuit to perform a quenching operation and then passes through a digital circuit to generate a pulse. As a result, when one photon is injected, one pulse is generated. Simultaneously, when the voltage drops to the ground GND to reach a voltage at which a breakdown of the light receiving element 110 does not occur, the bias quenching circuit 130 resets the voltage to restore the voltage to $V_{LOW}$ again.

As described above, in the quenching bias circuit device 100 of the present disclosure, which is used in the single photon detector, the feedback current mirror circuit 120 is applied as a passive component for a passive quenching, and the bias quenching circuit 130 is applied to speed up the quenching operation (an active quenching).

In order to increase accuracy, the feedback operation control circuit 170 and the feedback operation execution circuit 180 may be further employed. The feedback operation control circuit 170 shown in FIG. 6 may detect a variation in voltage at the sensing node 160 more closely to further detect an additional current generated in the light receiving element 110. Referring to FIG. 6, the feedback operation control circuit 170 may include a first comparator 611, a second comparator 612, and a control logic 620. The first comparator 611 and the second comparator 612 may be operational amplifiers OP-AMP.

The first comparator 611 and the second comparator 612 compare a sensing voltage $V_s$ at the sensing node 160 with reference voltages $VREF_H$ and $VREF_L$ to generate determination signals $P_1$, $P_2$, and $P_3$. The determination signals $P_1$, $P_2$, and $P_3$ are classified into three signals including a non-quenching operation signal, a quenching operation signal, and a hold-off operation signal.

When the sensing voltage $V_s$ is not generated at the light receiving element 110, the hold-off operation signal indicating a standby state is output. When the sensing voltage $V_s$ (for example, ranging from zero to 30 V) is generated, the non-quenching operation signal or the quenching operation signal is output according to comparison results of the first comparator 611 and the second comparator 612. That is, the determination signal $P_1$ is the non-quenching operation signal, the determination signal $P_2$ is the quenching operation signal, and determination signal $P_3$ is the hold-off operation signal. In other words, when the sensing voltage $V_s$ is greater than a reference value (e.g., 15 V), the first comparator 611 outputs the determination signal $P_1$, and, when the sensing voltage $V_s$ is smaller than a reference value (e.g., 3 V), the second comparator 612 outputs the determination signal $P_2$.

The control logic 620 generates control signals such as a quenching path control signal and a non-quenching path control signal using the output signals $P_1$ and $P_2$ of the first comparator 611 and the second comparator 612. To this end, the control logic 620 may be formed of an integrated circuit (IC) and the like.

Referring to FIG. 7, the feedback operation execution circuit 180 performs an operation in response to the control signal generated from the feedback operation control circuit 170. In other words, when switching elements 701 and 703 are turned on in response to the quenching path control signal, other switching elements 703 and 704 are turned on, and $V_{HIGH}$ and power of a charge pump$_1$ are summed to generate an applied voltage $V_G$ which is applied to the first switching element 501 of the feedback current mirror circuit 120. Some switching elements 702 and 705 induce a current from the charge pump$_1$ to the ground GND, and the switching element 704 allows a capacitor $C_1$ to be maintained in a charged state, thereby outputting a higher voltage. The capacitor $C_3$ is disposed for a load of the output. In other words, when the switching element 701 is turned on and the switching elements 702, 703, and 704 are turned off, charging is performed on the capacitor $C_1$.

Meanwhile, when switching elements 711 and 713 are turned on in response to the non-quenching path control signal, other switching element 712 is turned off so that $V_{HIGH}$ and power of a charge pump$_2$ are summed to be input to a third comparator 730. The third comparator 730 compares an input value with the reference voltage $VREF_L$, and, when the input value is smaller than the reference voltage $VREF_L$, the third comparator 730 outputs the determination signal $P_3$. The determination signal $P_3$ is the hold-off operation signal.

When the third comparator 730 does not output the determination signal $P_3$, the switching element 714 is turned on to generate the applied voltage $V_G$. Similar to the above description, a capacitor $C_2$ is also maintained in a charged state to output a higher voltage.

Finally, an amount of a current flowing in each of the light receiving element 110 and the feedback current mirror circuit 120 is set to be constant.

According to the related art, since the passive resistance element is used, it is vulnerable to a variation in a process-voltage-temperature (PVT) of an SPAD, and errors with respect to a current and a quenching time occur. In addition, according to the related art, since a monostable state and a control logic are separately processed externally, when an actual circuit is formed and a quenching circuit including the SPAD is formed as a micro-cell, a proportion of an area occupied by the SPAD in the micro-cell is decreased so that there is also a disadvantage in probability of detecting a single photon.

That is, since a characteristic of the SPAD is different, a voltage applied to $-V_{LOW}$ is differently varied, and thus a current flowing in the SPAD is varied so that a different result is exhibited even though the same single photon is detected. When an absolute value of a voltage applied to $-V_{LOW}$ is increased, a current flowing in the SPAD is increased, and, when the current is increased, a speed of reaction in a circuit is increased so that a quenching operation is begun more quickly.

According to the present disclosure, the above phenomenon may be compensated for using the feedback current mirror circuit 120.

That is, owing to a variance in SPAD, a difference in amount of a flowing current and a time difference between a passive quenching and an active quenching occur. Owing to the differences, since incorrect information may be transmitted to a read-out circuit, such as a time-to-digital converter (TDC) or an analog-to-digital converter (ADC) which is subsequent to the bias circuit, to degrade overall performance of the circuit, errors due to the difference in amount of the current and the time difference are compensated for using the feedback current mirror circuit 120. In addition, a voltage range of the reference voltage may be arbitrarily set so that sensing sensitivity may be controlled.

Figure 8:
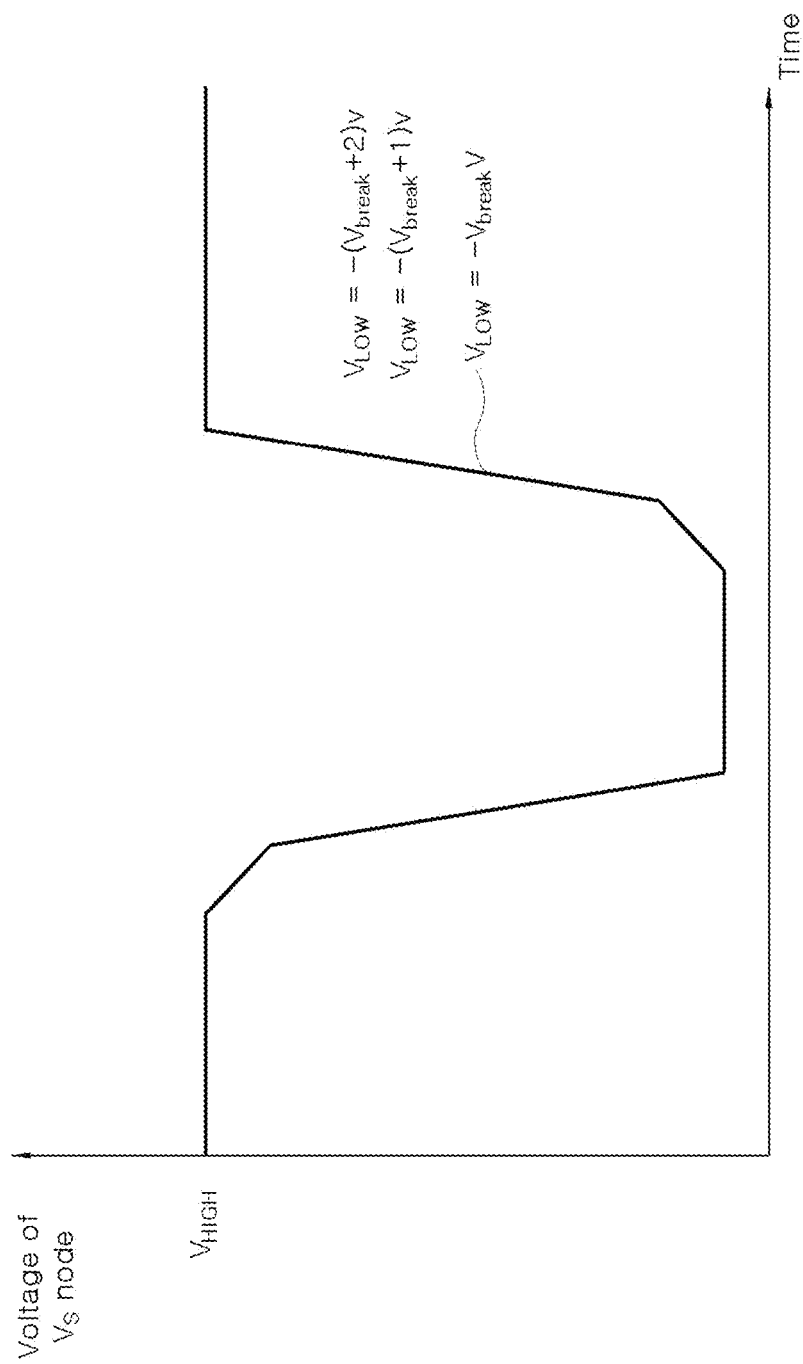
FIG. 8 is a graph illustrating a time difference according to a quenching operation at a sensing node and a variance in light receiving element of the quenching bias circuit device of the present disclosure.

Therefore, as shown in FIG. 8, the feedback current mirror circuit 120 is used to equalize currents flowing in the SPADs so that a difference in generation time and a difference in pulse width, which are generated due to the variation in SPAD, may be removed.

Generally, a positron emission tomography (PET)/computerized tomography (CT) equipment or a PET/magnetic resonance imaging (MRI) equipment may process information by detecting a single photon, wherein the information includes 1) an incident time of an incident photon and 2) the number of photons which are incident for a certain period of time after the incident time. Since a circuit capable of acquiring accurate time information and counting the number of photons within the same time is required, it is important to process the photons without errors in a circuit for detecting a photon, and, when a quenching bias circuit device using a feedback current mirror circuit is used, the same time information may be provided regardless of the variance in SPAD.

Figure 9:
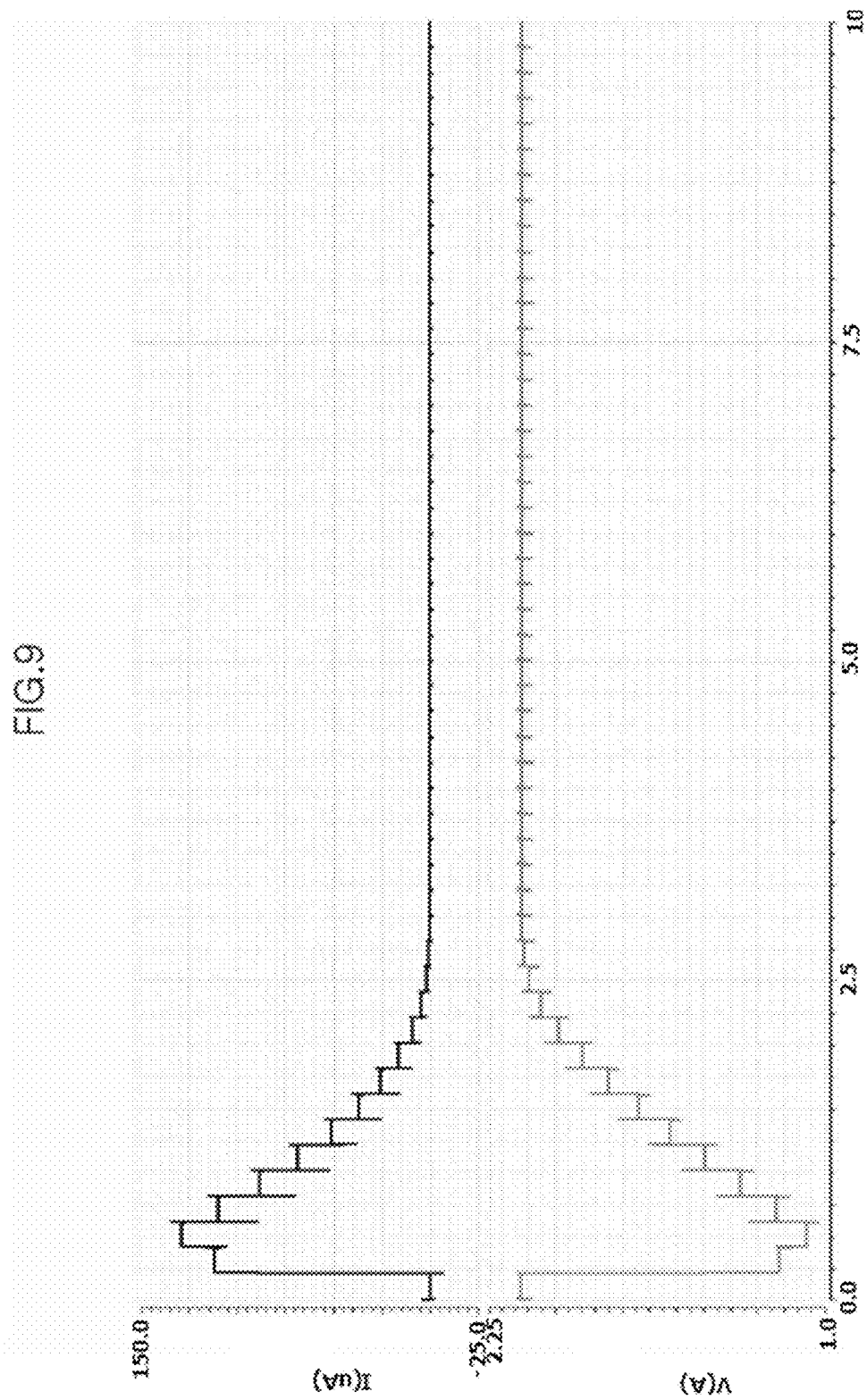
FIG. 9 is a graph showing a simulation result of the quenching bias circuit device of the present disclosure.

FIG. 9 is a graph showing a simulation result of the quenching bias circuit device of the present disclosure using the feedback control logic circuit.

The control logic is to operate in response to a turn-on condition of each of the switching elements (the non-quenching operation signal, the quenching operation signal, or the hold-off operation signal), and a sensing comparator serves to distinguish the non-quenching operation signal, the quenching operation signal, and the hold-off operation signal.

An upper line of the graph represents a variation in current at a $V_G$ node during a feedback process, and a lower line of the graph represents a variation in voltage at the $V_G$ node during the feedback process. It can be confirmed that the variations in current and voltage occurred while only feedback was provided, and there is no variation after the feedback was provided.

Figure 10A:
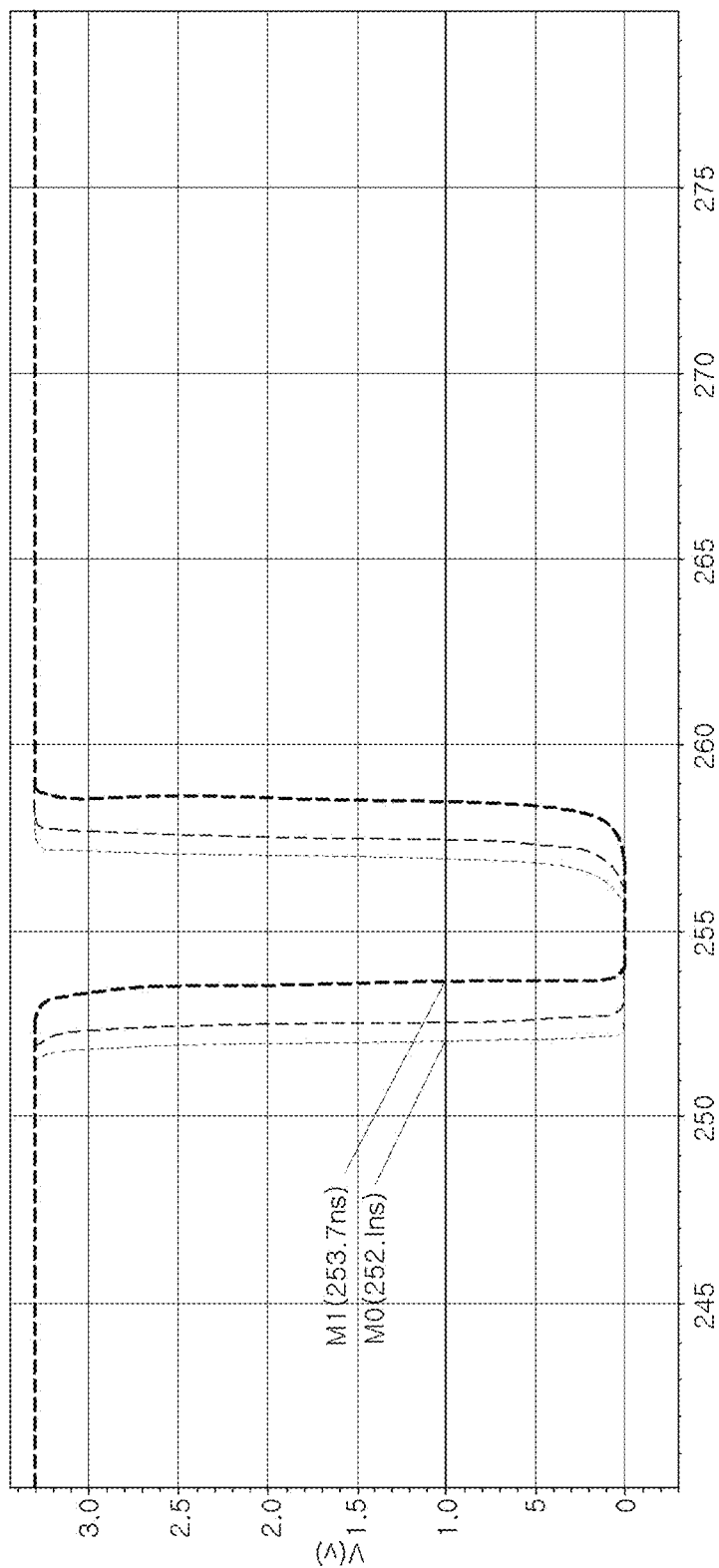
FIG. 10A is a graph showing a simulation result of a time difference according to a variance in light receiving element of a conventional bias circuit.
Figure 10B:
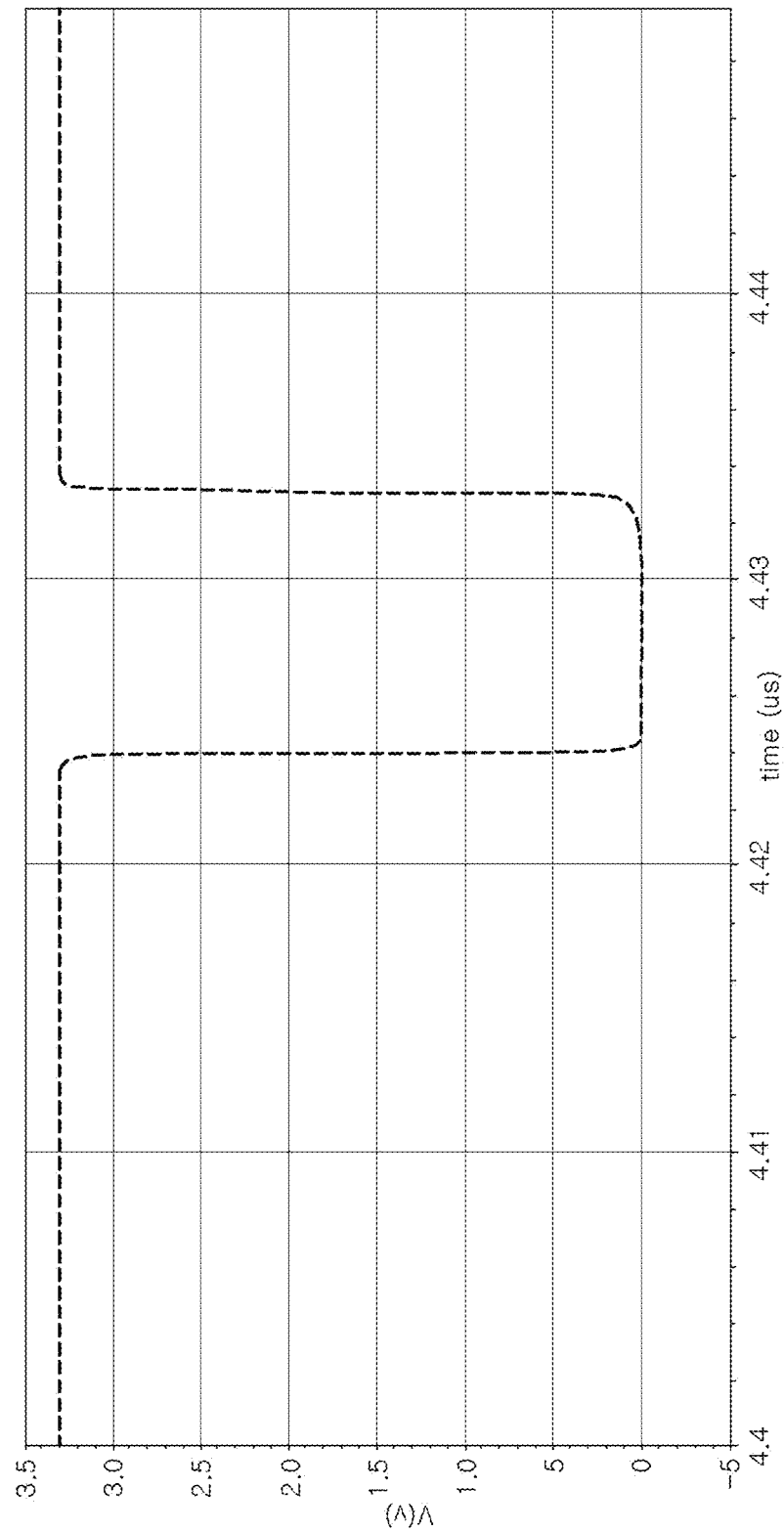
FIG. 10B is a graph illustrating a simulation result of a time difference according to a variance in light receiving element of a quenching bias circuit device of the present disclosure.

In addition, FIG. 10A is a graph showing a simulation result of a time difference according to a variance in light receiving element of a conventional bias circuit, and FIG. 10B is a graph illustrating a simulation result of a time difference according to a variance in light receiving element of a quenching bias circuit device of the present disclosure. In FIG. 10A, a time difference according to a variation in SPAD was exhibited as 1.6 ns, and in FIG. 10B, the time difference according thereto was exhibited as 100 ps or less.

Figure 11:
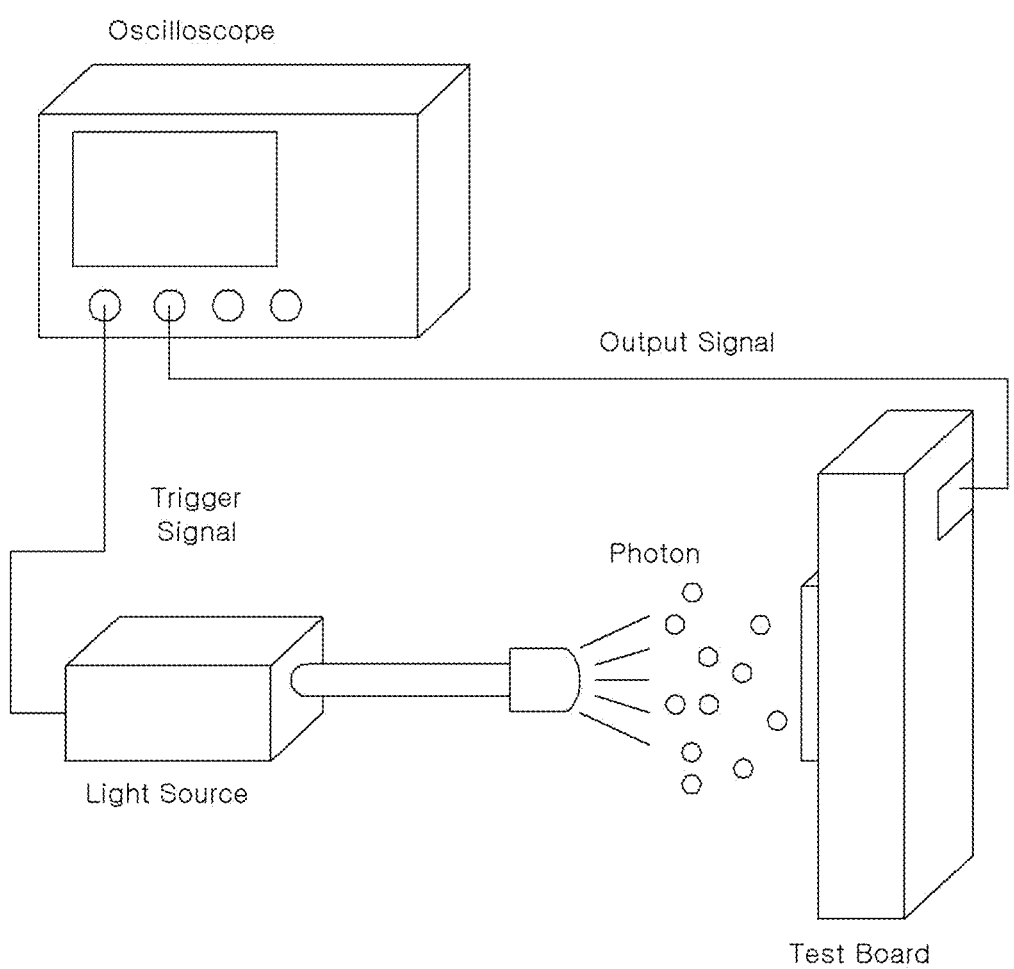
FIG. 11 is a diagram illustrating a device for a test of the quenching bias circuit device of the present disclosure.

FIG. 11 is a diagram illustrating a device for a test of the quenching bias circuit device of the present disclosure. The quenching bias circuit device was tested by applying a voltage ranging from −70 V to −72 V to an anode −$V_{LOW}$ of the SPAD using S10362-11-100C SPAD of Hamamatsu Photonics K.K. and measuring in a dark room using an oscilloscope, a light source, and a test board.

Figure 12A:
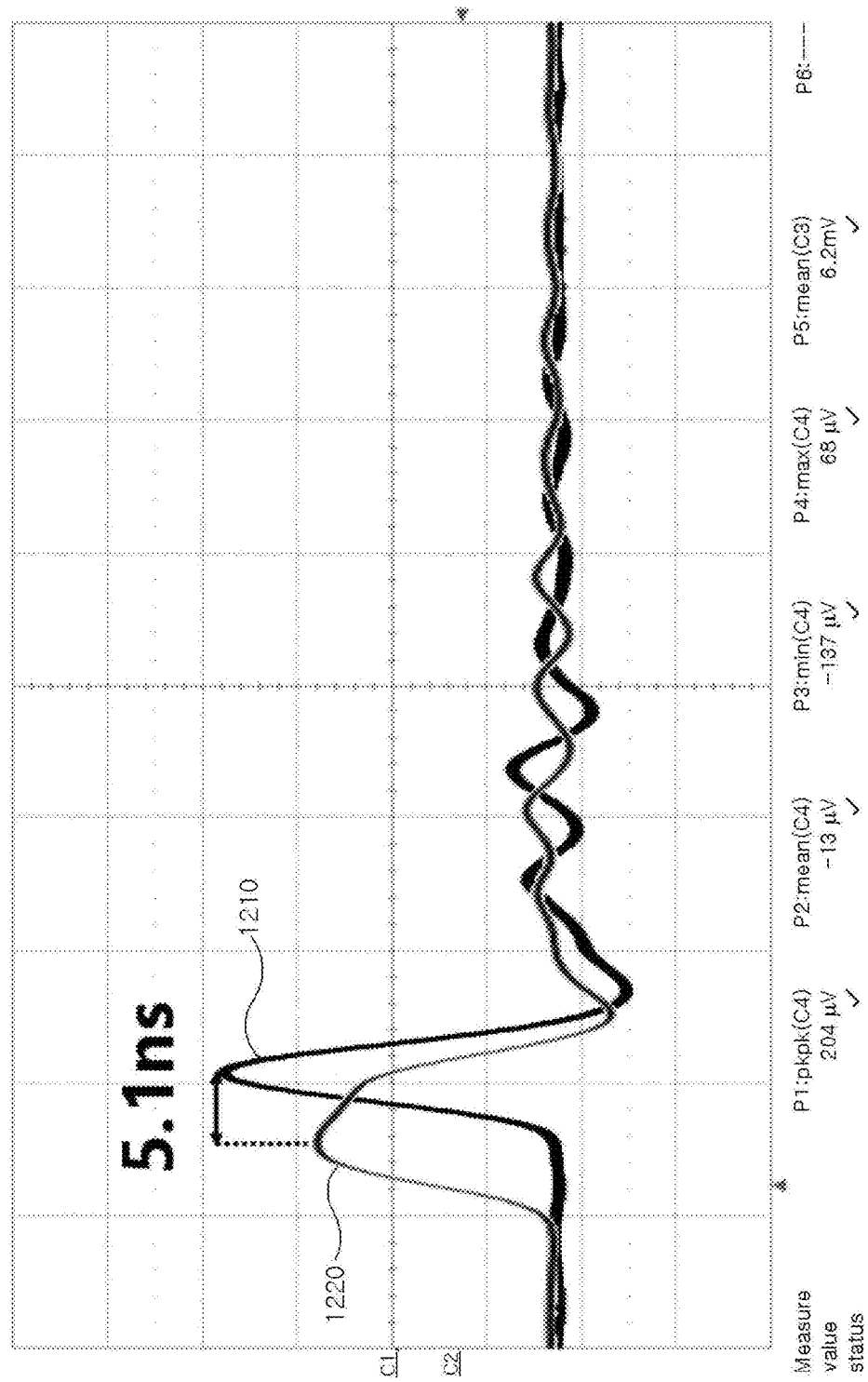

FIGS. 12A to 12C are graphs showing test results of the conventional bias circuit, a line 1220 indicates a pulse applied to the light source, and a line 1210 indicates a result value from an output of a quenching circuit. When a voltage of −72 V was applied to the anode −$V_{LOW}$ of the SPAD (see FIG. 12A), a delay between the light source and a quenching output was exhibited as about 5.1 ns. When a voltage of −71 V was applied to the anode −$V_{LOW}$ of the SPAD (see FIG. 12B), a delay between the light source and the quenching output was exhibited as about 6.1 ns. When a voltage of −70 V was applied to the anode −$V_{LOW}$ of the SPAD (see FIG. 12C). a delay between the light source and the quenching output was exhibited as about 7.2 ns.

Figure 13B:
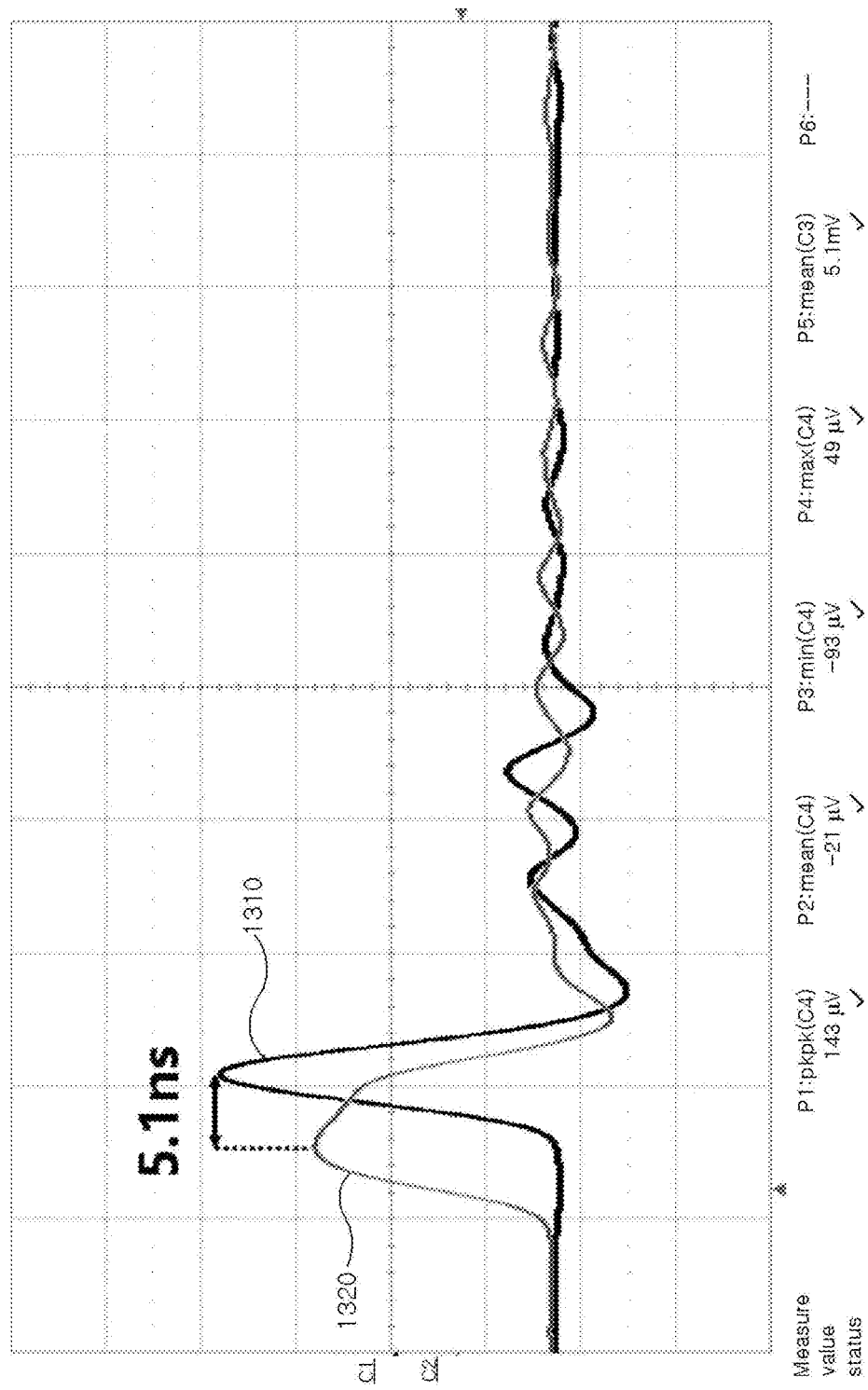

FIGS. 13A to 13C are graphs showing test results of the quenching bias circuit device of the present disclosure, a line 1320 indicates a pulse applied to the light source, and a line 1310 indicates a result value from an output of the quenching bias circuit device. When a voltage of −72 V was applied to the anode −$V_{LOW}$ of the SPAD (see FIG. 13A), a delay between the light source and a quenching output was exhibited as about 5 ns. When a voltage of −71 V was applied to the anode −$V_{LOW}$ of the SPAD (see FIG. 13B), a delay between the light source and the quenching output was exhibited as about 5.1 ns. When a voltage of −70 V was applied to the anode −$V_{LOW}$ of the SPAD (see FIG. 13C), a delay between the light source and the quenching output was exhibited as about 5.2 ns.

As described above, it can be seen that, according to the current feedback type of the present disclosure, the time difference of the output with respect to the variation in SPAD is reduced compared with a conventional resistor type. Specifically, the time difference of the resistor type ranged from 5.1 ns to 7.2 ns and the resistor type exhibited a difference of about 2.1 ns according to the difference in voltage of the anode, but the time difference of the current feedback type ranged from 5 ns to 5.2 ns and the current feedback type exhibited a difference of about 200 ps, which was only 10% of the resistor type.

In accordance with the present disclosure, an error according to a variance in light receiving element is compensated for so that it is possible to implement an accurate bias quenching circuit.

That is, without an addition of a circuit requiring for a large area or large power consumption, the same time information and the same counter information can be provided with only a simplified feedback current mirror circuit and a simplified quenching bias circuit device.

While the present disclosure has been described with reference to the accompanying drawings, it will be apparent to those skilled in the art that various changes and modifications can be made without departing from the spirit and scope of the present disclosure without being limited to the exemplary embodiments disclosed herein. Accordingly, it should be noted that such alternations or modifications fall within the claims of the present disclosure, and the scope of the present disclosure should be construed on the basis of the appended claims.

What is claimed is:

1. A quenching bias circuit device, comprising:
a light receiving element;
a feedback current mirror circuit arranged between a supply voltage and the light receiving element, the feedback current mirror circuit configured to induce a passive quenching operation so as to maintain a current flowing in the light receiving element to be constant;
a bias quenching circuit connected to a sensing node of the light receiving element and configured to perform an active quenching operation; and
a feedback operation control circuit configured to compare a sensing voltage of the sensing node with reference values and to determine the passive quenching operation according to a comparison result of the sensing voltage,
wherein the feedback operation control circuit detects an additional current generated from the light receiving element to set an amount of a current flowing in each of the light receiving element and the feedback current mirror circuit to be constant.

2. The quenching bias circuit device of claim 1, wherein the feedback current mirror circuit includes:
a first feedback current mirror circuit configured to receive a supply current; and
a second feedback current mirror circuit configured to induce a current, which is induced through the first feedback current mirror circuit, to the light receiving element.

3. The quenching bias circuit device of claim 2, wherein the first feedback current mirror circuit includes a plurality of NPN transistors disposed and matched to each other, and the second feedback current mirror circuit includes a plurality of PNP transistors disposed and matched to each other.

4. The quenching bias circuit device of claim 1 wherein the light receiving element includes a single photon light receiving element.

5. The quenching bias circuit device of claim 1, wherein the feedback operation control circuit includes:
- a first comparator configured to compare the sensing voltage with a first reference value among the reference values;
- a second comparator configured to compare the sensing voltage with a preset second reference value that is smaller than the first reference value; and
- a control logic configured to generate a control signal for the passive quenching operation according to comparison results of the first comparator and the second comparator.

6. The quenching bias circuit device of claim 5, wherein the control signal includes at least one of a quenching path control signal which executes the passive quenching operation or a non-quenching path control signal which does not execute the passive quenching operation.

7. The quenching bias circuit device of claim 5, wherein the first reference value and the second reference value are arbitrarily set for sensing sensitivity of the light receiving element.

8. The quenching bias circuit device of claim 6, wherein the feedback operation control circuit is further configured to execute the passive quenching operation which maintains the current flowing in the light receiving element to be constant according to a determination of the passive quenching operation.

9. The quenching bias circuit device of claim 6, further comprising a feedback operation execution circuit which includes:
- a first switching element configured to conduct first power from a first charge pump in response to the quenching path control signal;
- a first capacitor connected in parallel to the first switching element and configured to be charged with the first power; and
- a second capacitor connected in parallel to the first capacitor and configured to output an applied voltage, which is applied to the feedback current mirror circuit, using the supply voltage and the first power.

10. The quenching bias circuit device of claim 9, wherein the feedback operation execution circuit further includes:
- a second switching element configured to conduct second power from a second charge pump in response to the non-quenching path control signal;
- a third capacitor connected in parallel to the second switching element and configured to be charged with the second power; and
- a third comparator connected in parallel to the third capacitor and configured to generate a hold-off operation signal for a hold-off operation of the feedback current mirror circuit using the supply voltage and the second power.

11. The quenching bias circuit device of claim 10, wherein, when the holdoff operation signal is not generated, a third switching element, which is configured to connect an output of the third capacitor to the second capacitor, is disposed between the third comparator and the second capacitor.

12. The quenching bias circuit device of claim 10, wherein a fourth switching element grounded in parallel is disposed at a front stage of the first capacitor, the second capacitor, and the third capacitor.

13. The quenching bias circuit device of claim 1, wherein a supply current is constantly input to the feedback current mirror circuit.

14. A single photon detector comprising the quenching bias circuit device of claim 1.

* * * * *